US010502794B2

(12) United States Patent
Kim et al.

(10) Patent No.: US 10,502,794 B2
(45) Date of Patent: Dec. 10, 2019

(54) METHOD AND SYSTEM FOR PREDICTING THE TIME REQUIRED FOR LOW VOLTAGE EXPRESSION OF A SECONDARY BATTERY, AND AGING METHOD OF THE SECONDARY BATTERY USING THE SAME

(71) Applicant: LG CHEM, LTD., Seoul (KR)

(72) Inventors: So Hee Kim, Daejeon (KR); Nak Gi Sung, Daejeon (KR); Joon Sung Bae, Daejeon (KR)

(73) Assignee: LG CHEM, LTD., Seoul (KR)

(*) Notice: Subject to any disclaimer, the term of this patent is extended or adjusted under 35 U.S.C. 154(b) by 0 days.

(21) Appl. No.: 16/288,842

(22) Filed: Feb. 28, 2019

(65) Prior Publication Data
US 2019/0271746 A1    Sep. 5, 2019

(30) Foreign Application Priority Data

Mar. 5, 2018 (KR) .................. 10-2018-0025531

(51) Int. Cl.
*G01R 31/392* (2019.01)
*G01R 31/3842* (2019.01)
(Continued)

(52) U.S. Cl.
CPC ......... *G01R 31/392* (2019.01); *G01R 31/388* (2019.01); *G01R 31/389* (2019.01); *G01R 31/3842* (2019.01); *H01M 10/48* (2013.01)

(58) Field of Classification Search
CPC ............... G01R 31/392; G01R 31/388; G01R 31/3842; G01R 31/389; H01M 10/48
See application file for complete search history.

(56) References Cited

U.S. PATENT DOCUMENTS

| 5,541,489 A * | 7/1996 | Dunstan ............. G01R 31/3648 320/134 |
| 6,359,419 B1 | 3/2002 | Verbrugge et al. |
| 2006/0122655 A1 * | 6/2006 | Greatbatch ............ A61N 1/378 607/33 |

FOREIGN PATENT DOCUMENTS

| CN | 103197196 A * | 7/2013 |
| JP | 2000133319 A * | 5/2000 |

(Continued)

OTHER PUBLICATIONS

Richtek Technology, Designing Applications with Li-ion Batteries (Richtek), available at https://www.richtek.com/battery-nnanagement/en/designing-liion.html on Mar. 16, 2016 (Year: 2016).*

(Continued)

*Primary Examiner* — Daniel R Miller
(74) *Attorney, Agent, or Firm* — Birch, Stewart, Kolasch & Birch, LLP

(57) ABSTRACT

A method and system for predicting the time required for low voltage expression of a secondary battery, including (a) obtaining a leakage current by inputting a voltage of a battery cell of the secondary battery, measuring a freezing resistance of a battery cell, and dividing an input voltage by a measured freezing resistance, (b) obtaining a discharge capacity difference by setting a reference value of a voltage drop for selecting a low voltage defect and obtaining a discharge capacity difference between the input voltage and a voltage dropped therefrom by the reference value, and (c) dividing the discharge capacity difference by the leakage current to thereby calculate a time required for low voltage expression.

8 Claims, 4 Drawing Sheets

(51) Int. Cl.
    *G01R 31/389* (2019.01)
    *H01M 10/48* (2006.01)
    *G01R 31/388* (2019.01)

(56) References Cited

FOREIGN PATENT DOCUMENTS

| | | | | |
|---|---|---|---|---|
| JP | 2002-243813 | A | | 8/2002 |
| JP | 2003045500 | A | * | 2/2003 |
| JP | 2009-004389 | A | | 1/2009 |
| JP | 2010086885 | A | * | 4/2010 |
| JP | 2011069775 | A | * | 4/2011 |
| JP | 2014-063628 | A | | 4/2014 |
| JP | 5746856 | B2 | | 7/2015 |
| JP | 2016-090399 | A | | 5/2016 |
| KR | 10-2012-0012591 | A | | 2/2012 |
| KR | 20130021991 | A | * | 3/2013 |
| KR | 10-2015-0049526 | A | | 5/2015 |
| KR | 10-2015-0049528 | A | | 5/2015 |
| KR | 20150049526 | A | * | 5/2015 |
| KR | 10-2015-0063254 | A | | 6/2015 |

OTHER PUBLICATIONS

Texas Instruments, BQ25100B 250-mA Single Cell Li-Ion Battery Chargers Data Sheet, Jul. 2016 (Year: 2016).*
Lithium Battery Manufacturing, available at https://www.mpoweruk.com/battery_manufacturing.htm on Jan. 2, 2016 (Year: 2016).*
Gamry, Testing Lithium Ion Batteries, available at https://www.gamry.com/application-notes/battery-research/testing-lithium-ion-batteries/ on Apr. 13, 2016 (Year: 2016).*

* cited by examiner

[Fig. 1]
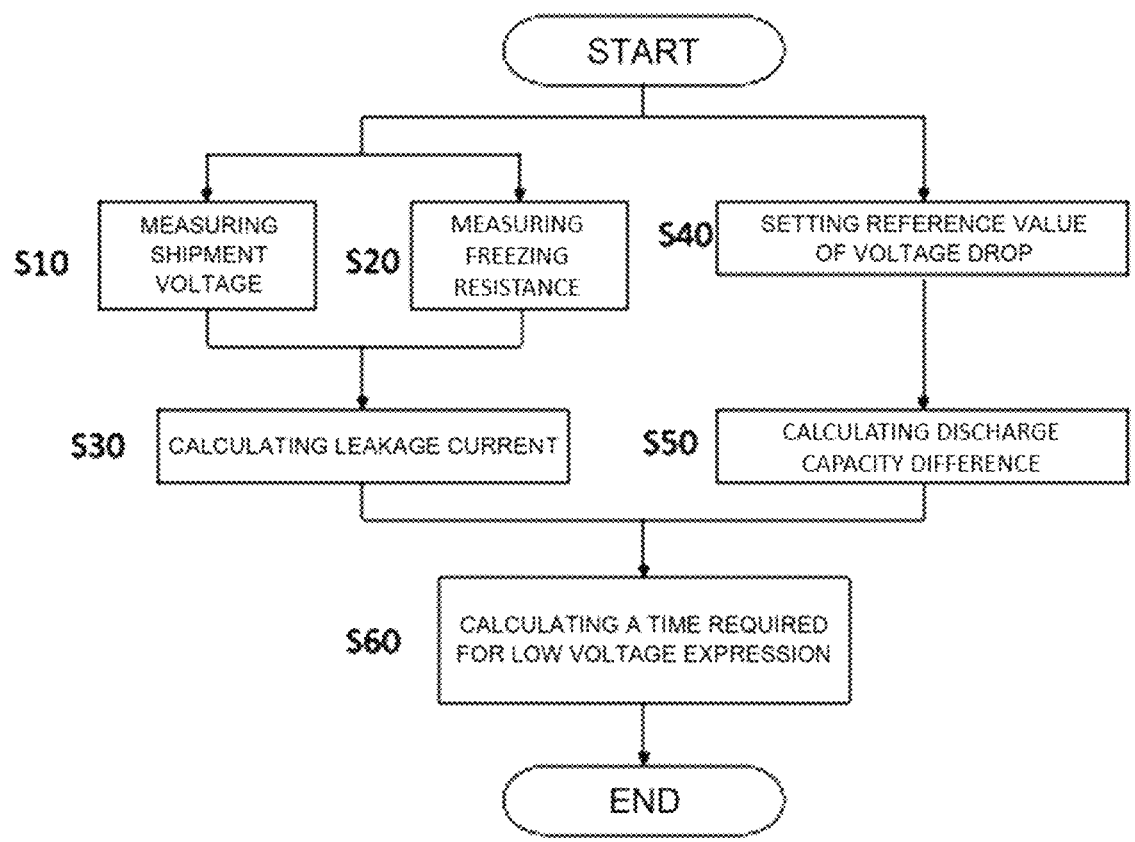

[Fig. 2A]
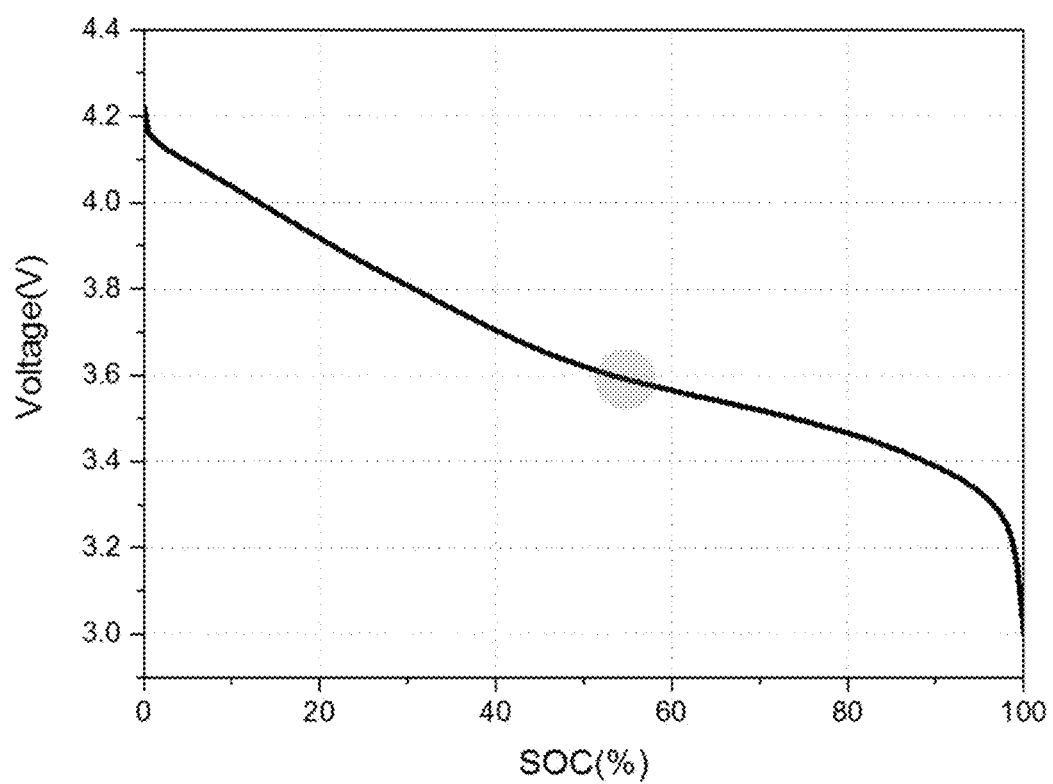

[Fig. 2B]
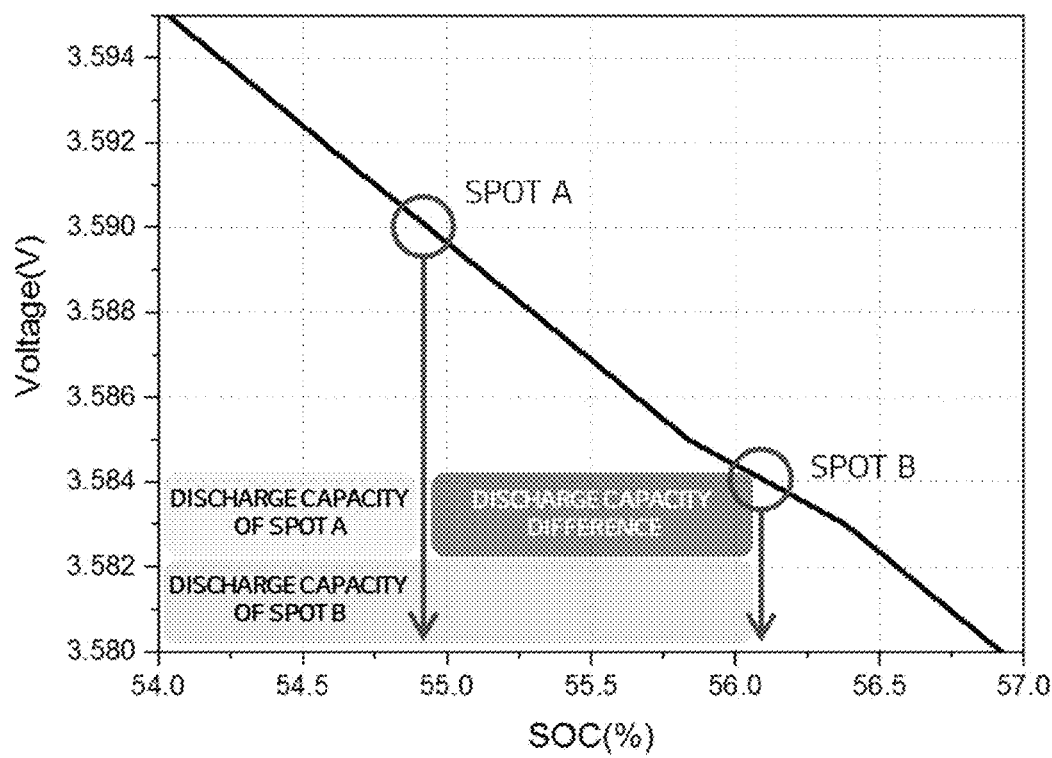

[Fig. 3]
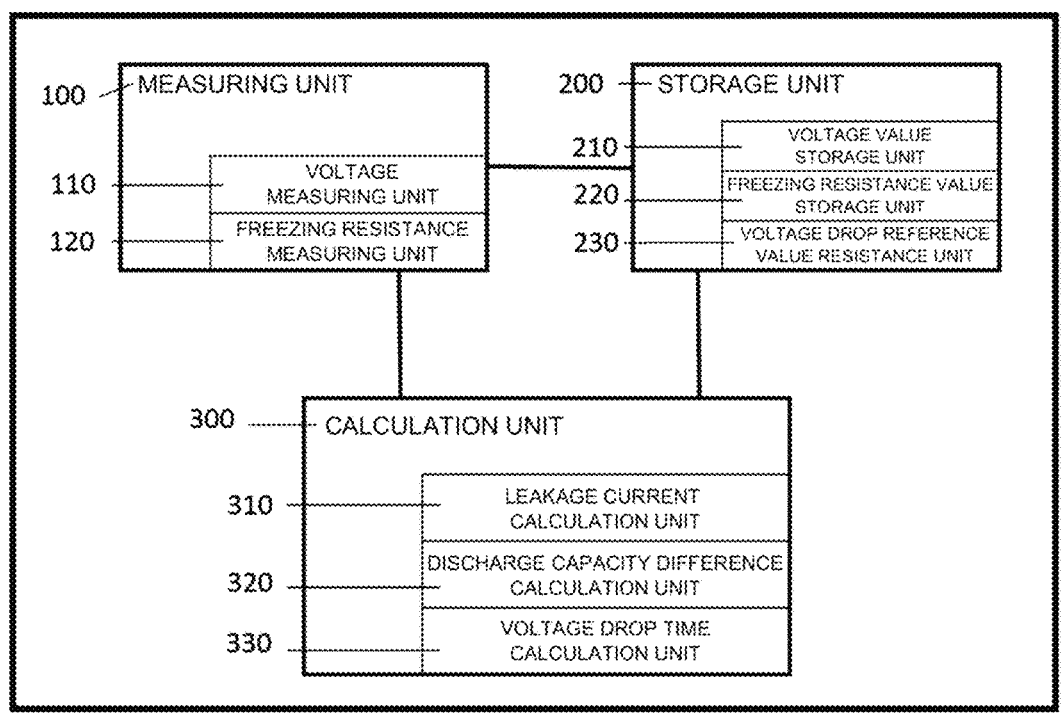

METHOD AND SYSTEM FOR PREDICTING THE TIME REQUIRED FOR LOW VOLTAGE EXPRESSION OF A SECONDARY BATTERY, AND AGING METHOD OF THE SECONDARY BATTERY USING THE SAME

TECHNICAL FIELD

The present invention relates to a method and system for predicting the time required for low voltage expression of a secondary battery, and a method for aging the secondary battery using the same, and more particularly, to a method and system for predicting the time required for low voltage expression of a secondary battery, which can improve the productivity by reducing the unnecessary aging time by predicting the low voltage expression time of the secondary battery and using the predicted low voltage expression time and can enhance the detection rate of defective batteries, and a method of aging the secondary battery using the method and system.

BACKGROUND ART

As technology development and demand for mobile devices are increasing and the spread of electric vehicles is expanding, demand for secondary batteries as energy sources is rapidly increasing. Among them, demand for lithium secondary batteries having high capacity and energy density is especially high.

Generally, a lithium secondary battery is fabricated by manufacturing an electrode assembly composed of a negative electrode, a positive electrode, and a separator, inserting the electrode assembly into a battery case, and injecting an electrolyte into the electrode assembly. The lithium secondary battery thus produced is required to be activated by a predetermined charge and discharge to function as a battery. Such a process is referred to as a formation process or an activation process. The secondary battery is also shipped after an aging process and a defective product sorting process. The aging process is an aging process in which the electrolyte is allowed to enter the empty space of the electrode to allow time for forming a stable electrolyte channel.

The secondary battery is manufactured so that a positive electrode and a negative electrode are prevented from being contacted by a porous insulating film (separator) to prevent a short circuit. However, insulation may not be properly maintained due to various reasons during the manufacturing process of the battery. As a result, an internal short circuit of the battery can occur. Lithium-ion batteries can be ignited or exploded when a positive electrode and a negative electrode are short-circuited. Even when they are slightly short-circuited, ions move and current flows. This condition is often referred to as a soft short or a micro short.

Soft-shorts cause low-voltage defects. Soft-short cells tend to take a relatively long time to be expressed as compared to hard-short cells, and their expression time vary considerably depending on the short-circuit state or degree.

Recently, a method of selecting a low voltage failure of a secondary battery in an activation process has been used to select a failure of the secondary battery. However, during the activation process, it is determined that the secondary battery is normal. However, the secondary battery may become further defective during the storage period until the secondary battery is inserted into the battery pack after the activation process is completed. In addition, a product to be judged as a low-voltage defect may be erroneously determined as a normal product and may be put into a battery pack together. Particularly, although the low voltage defect due to the soft short is measured by measuring the voltage fluctuation width through the aging process after the manufacture of the battery, it is difficult to select the low voltage defect within a short period of time. If the low voltage defect does not occur within a predetermined period, the defective products will be supplied.

In the conventional defective sorting process, although a difference in voltage drop between good and defective products is used, there is a problem that failure cannot be detected properly when the time for low voltage expression takes a long time. However, it is undesirable to perform the aging process for a long time until a low voltage failure is manifested because it decreases the productivity.

Therefore, if the time required for low-voltage expression can be predicted and utilized in the aging step, particularly in the shipping aging step, the unnecessary aging time can be shortened to thereby improve the productivity, and the defect detection rate can be increased to prevent the supply of defective products.

DISCLOSURE

Technical Problem

Accordingly, it is an object of the present invention to provide a method and system for predicting the time required for low-voltage expression of a battery cell in consideration of the above-described conventional problems and circumstances.

Further, the present invention provides a method for aging a secondary battery that can shorten the aging process time of the secondary battery by using the method of predicting the time required for the low voltage expression to improve the productivity and increase the defect detection rate in the defect selection process.

Technical Solution

In order to achieve the above object, the inventors of the present application have studied this subject from various aspects, and have found that the freezing resistance measured in a state where the battery cell is frozen is related to only the resistance of the short portion in the battery cell and have completed the present invention based thereon.

Therefore, a method for predicting the time required for low voltage expression of a secondary battery according to an embodiment of the present invention for achieving the above object includes:

(a) obtaining a leakage current by the following sub-steps (a-1) to (a-3):

(a-1) inputting a voltage of a battery cell of the secondary battery;

(a-2) measuring a freezing resistance in a state where the battery cell is frozen before, after, or simultaneously with the sub-step (a-1); and (a-3) dividing the input voltage by the measured freezing resistance to thereby calculate a leakage current;

(b) obtaining a discharge capacity difference by the following steps (b-1) and (b-2) performed before, after or simultaneously with the step (a):

(b-1) setting a reference value of a voltage drop for selecting a low voltage defect; and (b-2) obtaining a discharge capacity difference between the input voltage and a voltage dropped therefrom by the reference value; and (c) dividing the discharge capacity difference by the leakage current to thereby calculate a time required for low voltage expression.

Preferably, the freezing resistance in the sub-step (a-2) is measured after the battery cell is stored in liquid nitrogen for 10 to 30 minutes.

In a specific embodiment, the discharge capacity difference in the sub-step (b-2) may be obtained by using a full discharge voltage profile during an activation process of a normal battery cell.

In a specific embodiment, the voltage in the sub-step (a-1) may be a shipment voltage.

In a specific embodiment, the voltage in the sub-step (a-1) may be an open circuit voltage (OCV) before starting an aging process.

In a specific embodiment, the aging process may be an open circuit voltage (OCV) before starting a shipment aging process.

In a specific embodiment, the time required for low-voltage expression of the step (c) is derived by the following equations 1 and 2.

$$I1 = Ei/Rf \quad \text{<Equation 1>}$$

(where I1 denotes a leakage current (A), Ei denotes a voltage (V), and Rf denotes a freezing resistance (ω).)

$$T = Cd/I1 \quad \text{<Equation 2>}$$

(where T denotes time required for low voltage expression (hr), Cd denotes a discharge capacity difference (mAh), and I1 denotes a leakage current (mA).)

Further, a system for predicting the time required for low voltage expression of a secondary battery according to another embodiment of the present invention for achieving the above object includes:

a measuring unit, a storage unit, and a calculation unit, wherein the measuring unit includes a voltage measuring unit of a battery cell and a freezing resistance measuring unit of the battery cell of the secondary battery, wherein the storage unit includes a voltage value storage unit, a freezing resistance value storage unit, and a voltage drop reference value storage unit of a low voltage defect, and wherein the calculation unit includes a leakage current calculation unit, a discharge capacity difference calculation unit, and a voltage drop time calculation unit.

Further, in the method of aging the secondary battery during a predetermined period of time according to another embodiment of the present invention for achieving the above object has following features, the predetermined period of time is equal to or longer than a low voltage expression time predicted using the prediction method of the present invention.

Further, in a method of detecting a low voltage defect according to another embodiment of the present invention, the aging is terminated by using the aging method, and the low voltage defect is then detected by measuring the voltage or resistance of the battery.

Advantageous Effects

According to the present invention, time required for a low voltage expression of a secondary battery can be predicted using the prediction method of the present invention, and the aging process time of the secondary battery can be shortened by using the predicted time in the aging process, and the defect detection rate is increased to thereby prevent the defective cell from being shipped to the outside.

BRIEF DESCRIPTION OF THE DRAWINGS

FIG. 1 is a flowchart showing an example of a preferable process sequence of a method for predicting the time required for low voltage expression of a secondary battery according to the present invention.

FIG. 2A is a chart showing an example of a full-discharge voltage profile during an activation process of a normal battery cell.

FIG. 2B is an enlarged chart of a portion indicated by gray in the graph of FIG. 2A.

FIG. 3 is a schematic diagram showing a preferable overall configuration of a system for predicting the time required for low voltage expression of a secondary battery according to the present invention.

DETAILED DESCRIPTION OF THE PREFERRED EMBODIMENTS

Hereinafter, the present invention will be described more specifically with reference to the accompanying drawings. It is to be understood that the following detailed description and drawings are merely illustrative of the embodiments of the present invention, and therefore the present invention should not be construed as being limited to the description and contents.

First, the terms used in the present invention will be described. The term 'shipment voltage (V)' in the present invention means an initial charging voltage when a lithium secondary battery is manufactured and shipped from a factory.

In the present invention, terms such as "a" and "a-1" are used as in "step (a)", "sub-step (a-1)", but it is to be understood that these terms are used to distinguish the process steps and the like from each other in order to facilitate understanding of the present invention, and the scope of the present invention should not be unduly construed by these terms.

The present invention provides a method for predicting time required for a low voltage expression of a secondary battery and the prediction method includes steps of: (a) obtaining a leakage current; (b) obtaining a discharge capacity difference; and (c) dividing the discharge capacity difference by the leakage current to thereby calculate a time required for low voltage expression. The steps (a) and (b) can be performed in an arbitrary order or simultaneously.

Specifically, the step (a) of obtaining the leakage current may include sub-steps of: (a-1) inputting a voltage of a battery cell; (a-2) measuring a freezing resistance in a state where the battery cell is frozen before, after, or simultaneously with the sub-step (a-1); and (a-3) dividing an input voltage by a measured freezing resistance to thereby calculate a leakage current.

The method of predicting the time required for low-voltage expression of the present invention can be utilized in a conventional defect detection process, and it is difficult to select good products and defective products that have not been sorted until the final step. Therefore, when the method of predicting the time required for low voltage expression is utilized, there is an advantage that the defective battery can be efficiently selected.

In an embodiment of the present invention, the voltage of the step (a-1) of inputting the voltage of the battery cell may be the OCV of the battery measured before starting the aging process.

In another embodiment of the present invention, the voltage of the step (a-1) of inputting the voltage of the battery cell may be the OCV of the battery measured before starting the shipment aging process.

In another embodiment of the present invention, instead of measuring the voltage of the battery cell, a preset shipping voltage may be input according to a recipe of the manufacturing process.

The step (b) of obtaining the discharge capacity difference includes: (b-1) setting a reference value of a voltage drop for selecting a low voltage defect; and (b-2) obtaining a discharge capacity difference between the measured voltage and a voltage dropped therefrom by the reference value. The discharge capacity difference can be obtained by utilizing the discharge voltage profile of the normal cell, and an example of the discharge voltage profile of the normal cell is shown in FIGS. 2A and 2B.

The desirable process order of the method for predicting time required for low voltage expression of a secondary battery according to the present invention is illustrated as a flowchart of FIG. 1. Referring to FIG. 1, a voltage of a battery cell and a freezing resistance are measured (S10 and S20), the inputted voltage and measured freezing resistance are used in Equation 1 to thereby calculate the leakage current (S30), the reference value of the voltage drop for selecting a low voltage defect is set (S40), and a discharge capacity difference between a voltage dropped by the reference value and the inputted voltage is obtained (S50). After calculating the leakage current and the discharge capacity difference as described above, the time required for low voltage expression is calculated by the following Equation 2 (S60).

$$Il=Ei/Rf \qquad \text{<Equation 1>}$$

In the above equation, Il denotes a leakage current (A), Ei denotes a voltage (V), and Rf denotes a freezing resistance (Ω).)

$$T=Cd/Il \qquad \text{<Equation 2>}$$

(Where T is the time required for low voltage expression (hr), Cd is the discharge capacity difference (mAh), and Ii is the leakage current (mA).)

In the sub-step (a-2), the resistance is measured by freezing the battery cell. This is for measuring the resistance of only the short portion inside the cell. When the resistance of the battery cell is measured while the battery cell is frozen, the resistance of the battery cell is overflowed because the ionic conductivity of the electrolyte becomes almost zero, showing the physical properties of the insulator. If there is a short-circuit inside the separator due to metal foreign matter, the resistance value between the positive and negative electrodes shows the physical properties of the conductor. Therefore, the measured resistance value can be regarded as the resistance of the short portion in the cell.

In a specific embodiment, the freezing resistance in sub-step (a-2) can be stored and measured in liquid nitrogen for about 10 to 30 minutes, preferably for 15 to 25 minutes, and most preferably for a time that the resistance value is overflown after the cell is frozen. If the storage time is less than 10 minutes, the cell may not be sufficiently frozen, which may be undesirable. However, depending on the type of the cell, the freezing time of an appropriate value can be selected.

In the sub-step (b-1), the selection criterion for the low voltage defect may be different according to the quality control standard, and if the voltage drop of the reference spec or more occurs, it is preferable to be selected as the low voltage defect and removed.

The discharge capacity difference obtained in the sub-step (b-2) means a difference in discharge capacity between the discharge voltage and the voltage dropped by a value recognized as the low voltage defect, and may be obtained by using the full discharge voltage profile of the normal battery cell.

FIGS. 2A and 2B are charts showing an example of a full-discharge voltage profile of a normal battery cell. In this chart, when the voltage drops from the point A to the point B, the discharge capacity difference (mAh) at the two voltages is obtained, and the voltage drop consumption time can be calculated by dividing the discharge capacity difference by the leakage current (mA) calculated by the equation 1.

In addition, the present invention provides a system for predicting the time required for low voltage expression of a secondary battery as another aspect, and a preferable overall configuration of the present prediction system is schematically shown in FIG. 3. Referring to FIG. 3, the prediction system includes a measuring unit 100, a storage unit 200, and a calculation unit 300.

The measuring unit 100 includes a voltage measuring unit 110 for measuring a shipping voltage of the battery cell and a freezing resistance measuring unit 120 for measuring a freezing resistance in a state where the battery cell is frozen. The storage unit 200 includes a voltage value storage unit 210 for storing the measured shipping voltage, a freezing resistance value storage unit 220 for storing the measured freezing resistance, and a voltage drop storage unit 220 for storing a reference value of a voltage drop which is set for determining the low voltage defect. The calculation unit 300 includes a leakage current calculation unit 310 for calculating a leakage current using the measured shipping voltage and the measured freezing resistance, a discharge capacity difference calculation unit 320 for calculating a discharge capacity difference between the shipping voltage and a voltage dropped from the shipping voltage by the reference value, a voltage drop time calculation unit 330 for calculating time required for low voltage expression by using the discharge capacity difference and the leakage current.

According to another aspect of the present invention, there is provided a method for aging a secondary battery for a predetermined period of time in which the predetermined period of time is equal to or longer than a time required for low voltage expression predicted using the prediction method of the present invention.

When the aging process is completed during the above-mentioned period, the voltage, resistance, and the like are measured to select the defective battery such as the low voltage.

Meanwhile, the aging method itself to be performed by the present invention is well known in the art, and can be employed without any particular limitations in known specific methods and conditions, and a detailed description thereof will be omitted.

As described above, in the aging method of the present invention, as the period of time required for the low-voltage expression of the secondary battery is predicted in advance and the aging process is performed for a time substantially equal to or slightly longer than the predicted period, when the low voltage expression period is relatively short, it is possible to shorten the unnecessary aging process period to improve the productivity, and when the low voltage expression period is relatively long, it is possible to prevent the defective cell from being shipped to the outside without being sorted out in the subsequent defective sorting process.

This effect is very significant in light of the fact that the lithium ion battery requires a relatively long formation and aging period compared to other batteries.

While the present invention has been particularly shown and described with reference to exemplary embodiments thereof, it is to be understood that the invention is not to be limited to the details thereof, and it will be apparent to those skilled in the art that various modifications such as the above description, substitutions of components and the like, addition of additional components, and the like may be made without departing from the scope of the present invention based on the above description.

DESCRIPTION OF SYMBOLS

100: measuring unit
110: voltage measuring unit
120: freezing resistance measuring unit
200: storage unit
210: voltage value storage unit
220: freezing resistance value storage unit
230: voltage drop reference value storage unit
300: calculation unit
310: leakage current calculation unit
320: discharge capacity difference calculation unit
330: voltage drop time calculation unit

The invention claimed is:

1. A method for predicting a time required for low voltage expression of a secondary battery, the method comprising the steps of:
(a) obtaining a leakage current of a battery cell of the secondary battery by the following sub-steps (a-1) to (a-3):
(a-1) inputting a voltage of the battery cell of the secondary battery;
(a-2) measuring a freezing resistance of the battery cell in a state where the battery cell is frozen before, after, or simultaneously with the sub-step (a-1); and
(a-3) dividing the input voltage by the measured freezing resistance to thereby calculate the leakage current of the battery cell;
(b) obtaining a discharge capacity difference for the battery cell by the following steps (b-1) and (b-2) performed before, after or simultaneously with the step (a):
(b-1) setting a reference value of a voltage drop for selecting a low voltage defect; and
(b-2) obtaining the discharge capacity difference for the battery cell between the voltage inputted and the reference value of the voltage drop for selecting the low voltage defect; and
(c) dividing the discharge capacity difference by the leakage current to thereby calculate a time required for low voltage expression,
wherein the battery cell is frozen when ionic conductivity of electrolyte of the battery cell becomes almost zero, and
wherein the voltage in the sub-step (a-1) is an open circuit voltage (OCV) before starting an aging process.

2. The method of claim 1, wherein the freezing resistance in the sub-step (a-2) is measured after the battery cell is stored in liquid nitrogen for 10 to 30 minutes.

3. The method of claim 1, wherein the discharge capacity difference in the sub-step (b-2) is obtained by using a full discharge voltage profile during an activation process of a normal battery cell.

4. The method of claim 1, wherein the voltage in the sub-step (a-1) is a shipment voltage.

5. The method of claim 1, wherein the aging process is a shipment aging process.

6. The method of claim 1, wherein time required for low-voltage expression of the step (c) is derived by the following equations 1 and 2:

$$Il = Ei/Rf \qquad \text{<Equation 1>}$$

where Il denotes a leakage current (A), Ei denotes a voltage (V), and Rf denotes a freezing resistance (Ω), $$T = Cd/Il \qquad \text{<Equation 2>}$$

where T denotes time required for low voltage expression (hr), Cd denotes a discharge capacity difference (mAh), and Il denotes a leakage current (mA).

7. A method for aging a secondary battery for a predetermined period of time,
wherein the predetermined period of time is equal to or longer than a time required for low voltage expression predicted by using the method for predicting the time required for low voltage expression of the secondary battery according to claim 1.

8. A system for predicting a time required for low voltage expression of a secondary battery, the system being configured to:
(a) obtain a leakage current of a battery cell of the secondary battery by the following sub-steps (a-1) to (a-3):
(a-1) input a voltage of the battery cell of the secondary battery;
(a-2) measure a freezing resistance of the battery cell in a state where the battery cell is frozen before, after, or simultaneously with the sub-step (a-1); and
(a-3) divide the input voltage by the measured freezing resistance to thereby calculate the leakage current of the battery cell;
(b) obtain a discharge capacity difference for the battery cell by the following steps (b-1) and (b-2) performed before, after or simultaneously with the step (a):
(b-1) set a reference value of a voltage drop for selecting a low voltage defect; and
(b-2) obtain the discharge capacity difference for the battery cell between the voltage inputted and the reference value of the voltage drop for selecting the low voltage defect; and
(c) divide the discharge capacity difference by the leakage current to thereby calculate a time required for low voltage expression,
wherein the battery cell is frozen when ionic conductivity of electrolyte of the battery cell becomes almost zero, and
wherein the voltage in the sub-step (a-1) is an open circuit voltage (OCV) before starting an aging process.

* * * * *